United States Patent
Papathomas et al.

(10) Patent No.: US 6,251,469 B1
(45) Date of Patent: Jun. 26, 2001

(54) METHOD OF RENDERING A SUBSTRATE SELECTIVELY NON-WETTABLE CHIP CARRIER WITH ENHANCED WIRE BONDABILITY

(75) Inventors: Konstantinos Papathomas, Endicott; Bernd Karl Appelt, Apalachin; John Joseph Konrad, Endicott, all of NY (US)

(73) Assignee: International Business Machines, Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/822,564

(22) Filed: Mar. 19, 1997

(51) Int. Cl.$^7$ .................................................. B05D 5/12
(52) U.S. Cl. .................. 427/58; 427/372.2; 427/387; 427/421; 427/430.1
(58) Field of Search ............................. 427/387, 58, 421, 427/430.1, 372.2

(56) References Cited

FOREIGN PATENT DOCUMENTS 58-220434   12/1983   (JP) .
1286428    11/1989   (JP) .

*Primary Examiner*—Bernard Pianalto
(74) *Attorney, Agent, or Firm*—Heslin & Rothenberg, P.C.

(57) ABSTRACT

A substrate that is substantially non-wettable to adhesive resin is disclosed. The substrate is coated with a fluorinated silane composition. Preferable fluorosilane compositions include perfluoroalkyl alkylsilanes of Formula III:

$$R^5_n R^6_m SiX_{4-(n+m)} \qquad \text{III}$$

wherein $R^5$ is a perfluoroalkyl alkyl radical; $R^6$ is alkyl or alkenyl; X is acetoxy, halogen or alkoxy; n is 1 or 2; and m is 0 or 1. The composition is preferably applied in solution and upon evaporation of the solvent, forms a durable, non-wetting, yet well-adhering surface. In a preferred embodiment, the substrate is a chip carrier with enhanced wire bondability for use in the manufacture of a semiconductor device.

19 Claims, No Drawings

METHOD OF RENDERING A SUBSTRATE SELECTIVELY NON-WETTABLE CHIP CARRIER WITH ENHANCED WIRE BONDABILITY

TECHNICAL FIELD

This invention relates generally to a substrate that is selectively non-wettable to adhesive resin and more particularly, the invention relates to a chip carrier with enhanced wire bondability that has been treated with a fluorine-containing compound.

BACKGROUND ART

Plastic chip carriers are typically comprised of an organic substrate, such as a polyimide, having areas of metallic circuitry and wire bond pads. One of the initial stages of the assembly of a chip carrier is typically a board-attach process, during which an organic substrate is attached to a lead frame by means of a thixotropic organic adhesive, such as, for example, an epoxy-based adhesive, an acrylic-based adhesive or a silicone. The adhesive is applied to the lead frame and the substrate is then placed onto the adhesive. The assembly may then be heated to assist in the cure of the adhesive, strengthening the attachment between the substrate and the lead frame. Similar adhesives and processes are used in later stages of device assembly, such as in a die-attach process when integrated circuit chips or devices are bonded to the chip carrier. Depending on the design of the chip carrier, it may not contain a lead frame. By necessity, a chip carrier will always contain a die and most commonly a back-bonded die which is interconnected via wire bonding.

Although the adhesives used during the various stages of device assembly are fairly viscous, they have a propensity to bleed and spread out away from the point of attachment. For example, during the board-attach process, resin from the adhesive often bleeds out from the periphery of the chip carrier attachment area, and spreads up the edges of the chip carrier onto the circuitized upper surface, where it can contaminate the wire bond pads and render them non-bondable. This condition will cause significant problems during later assembly steps when the bond sites are needed to complete necessary electrical connections. As the resin spreads away from the attachment area, it can contaminate not only the wire bond sites, but also any portions of a soldermask which may lie in the near vicinity.

The problems associated with adhesive resin bleed are even more pronounced when the chip carrier has been treated with a plasma containing oxygen and/or argon, prior to the application of the adhesive. Such plasma treatment is frequently employed to clean the wire bond sites and to roughen up the substrate surface prior to assembly of the semiconductor device.

Resin bleed is also encountered during other stages of semiconductor device assembly. For example, during the die-attach process, an electrically or non-electrically conductive adhesive is used, and it too, can bleed out along the periphery of the die attachment area and spread out over adjacent areas where electrical connections ultimately need to be made.

Various methods for reducing resin bleed have been developed. For example, the chip carrier surface may have a recess at the point of attachment of the die, such that the die and adhesive will be recessed below the adjoining areas o f the chip carrier where electrical bonding sites are located. As a drawback to this method, not all integrated circuit assemblies provide the option of a recessed cavity in the carrier surface. Very large scale integrated circuit (VLSI) assemblies, for example, require a large number of bonding sites and these are at the same level as the die attachment surface.

U.S. Pat. No. 5,409,863, issued Apr. 25, 1995, teaches a method for controlling adhesive spread during a die-attach process. This method incorporates a low profile barrier, such as a solder mask ring, into the chip carrier structure. The barrier surrounds the perimeter of the die attachment area, preventing the spread of adhesive resin onto the adjacent bonding sites on the chip carrier.

In light of the many problems associated with adhesive resin bleed, a substrate, such as a chip carrier, that is not subject to this phenomenon, and thus has enhanced wire bondability, is therefore desirable. Furthermore, because of this desirability, a method for rendering a substrate substantially n on-wettable to adhesive resin, and therefore not subject to resin bleed, is especially desirable.

SUMMARY OF THE INVENTION

In accordance with the principles of the present invention, a substrate, such as a chip carrier, with enhanced wire bondability is provided. The surfaces of the substrate, which may be both organic and metallic, are coated with a fluorosilane composition. The coating renders the substrate substantially non-wettable, yet well-adhering, to adhesive resin, thus preventing the resin from spreading away from the point of attachment and contaminating other areas of the substrate.

According to one aspect of the present invention, a fluorosilane is combined with an appropriate solvent and the resulting solution is then applied to the surfaces of a substrate by any conventional method and allowed to dry. The application of the fluorosilane composition has been shown to render both organic and the metallic surfaces of a substrate substantially non-wettable to adhesive resin and therefore, free from resin bleed during an attachment process. When used in the context of the present invention, the term "non-wettable" is not to be confused with non-adherent as the disclosed process does not affect the quality of the adhesion between either the die attach or the board attach adhesives and the treated surfaces.

In a preferred embodiment of the invention, the substrate is a chip carrier. In this embodiment, the fluorosilane coating provides the chip carrier with enhanced wire bondability due to the absence of resin bleed and the associated wire bond pad contamination.

DEFINITIONS

The following terms have the indicated meanings within the context of the present invention. "Alkyl" is intended to include linear, branched or cyclic hydrocarbon structures and combination thereof. "Lower alkyl" refers to alkyl groups of from 1 to 8 carbons. Examples of lower alkyl groups include methyl, ethyl, propyl, isopropyl, butyl, s- and t-butyl, pentyl, hexyl, octyl, cyclopropylethyl, bornyl and the like. Preferred alkyl groups are those of $C_{30}$ or below.

"Perfluoroalkyl" refers to alkyl groups wherein each of the H atoms has been substituted by a F atom. Preferred perfluoralkyl groups are of the formula $C_nF_{2n+1}$, wherein n is an integer from 1 to 30.

"Cycloalkyl" is a subset of alkyl and includes cyclic hydrocarbon groups of from 3 to 8 carbon atoms. Examples of lower cycloalkyl groups include c-propyl, c-butyl, c-pentyl, norbonyl and the like.

"Alkoxyl" refers to groups of from 1 to 8 carbon atoms of a straight, branched or cyclic configuration and combinations thereof attached to oxygen. Examples include methoxy, ethoxy, propoxy, isopropoxy, cyclopropyloxy, cyclohexyloxy and the like.

"Halogen" includes F, Cl, Br and I.

It is intended that the definitions of any substituent or symbol (e.g., X) in a particular molecule be independent of its definition elsewhere in the same molecule. Thus, —SiX$_3$ represents —SiCl$_3$, —Si(OCH$_3$)$_3$, —Si(CH$_3$)Cl$_2$, —Si(OCH$_2$CH$_3$)$_2$CH$_3$, etc.

The foregoing and other objects, features and advantages of the invention will be apparent from the following more particular description of preferred embodiments of the invention.

BEST MODE FOR CARRYING OUT THE INVENTION

In accordance with the principles of the present invention, a substrate is coated with a fluorosilane composition. Such treatment renders both organic and inorganic surfaces of the substrate substantially non-wettable to adhesive resin and provides the surfaces with reduced to negligible resin bleed contamination. In a preferred embodiment, the substrate is a semiconductor chip carrier. In this embodiment, adhesives used during device assembly steps are prevented from bleeding and spreading onto the wire bond sites, thus providing the chip carrier with enhanced wire bondability.

The principles of the present invention can be applied to any organic resinous material used to for m the underlying surface of a substrate of a semiconductor chip carrier. Examples of such materials include, for example, epoxy-based resins, epoxy re sin s reinforced with woven or non-woven fiberglass, cyanate esters, cyanate/epoxy blends, polyimides and bismoleimide triazene resins.

In addition to coating the organic components of the substrate, the fluorosilane composition also coats any inorganic materials present on the substrate, such as those used to form the circuit lines, the ground pads and the wire bond sites. These inorganic materials include, for example, copper, from which the circuitry is formed and gold, which along with nickel is plated over the copper circuitry to provide a wire bondable-surface and to provide protection against corrosion. Palladium can also be employed either directly over copper or in conjunction with gold and/or nickel. It has been determined that the application of the fluorosilane composition does not adversely effect the bondability of the metallic sites, nor the integrity of subsequent electrical connections made using the coated bond sites.

The fluorosilane coating also coats any other organic materials present on the surface of the substrate, such as in the case of a chip carrier, a soldermask. These materials are also rendered substantially non-wettable to adhesive resin. Examples of such materials include epoxy-based and acrylate-based resins, as well as combinations thereof. An example of a frequently used epoxy/acrylate-based soldermask material is, "Vacrel", available from E. I duPont de Nemours Corporation, Wilmington, Del.

In one aspect of the invention, a fluorosilane is combined with a suitable solvent at a concentration of preferably, about 0.005 to 5 percent by volume, and the resulting solution is then applied onto a substrate and allowed to dry, preferably in air at room temperature. The coated substrate may be rinsed with, for example, water, prior to drying. To facilitate curing of the fluorosilane coating, the coated substrate may be exposed to a heat source, for example, by baking at a temperature of about 100 to 150° C. for about 15 to 30 minutes, although higher temperatures and shorter bake times may be used. For example, cure cycles of about 2 to 5 minutes at about 200 to 250° and more particularly, of about 3 minutes at about 250° are suitable.

Measurements obtained by the liquid drop method, utilizing a Goniometer and a liquid reactive resin, e.g., Union Carbide ERL-4299, demonstrate that the contact angle for a fluorosilane coated substrate surface is significantly higher than that for a non-treated surface of the same substrate. Contact angles of less than about 25 degrees on either an organic or a metallic surface, indicate that the surface has a propensity to be wettable and therefore to be susceptible to adhesive resin bleed.

It has been demonstrated that the contact angles of non-treated polyimide and gold surfaces range from about 6 to 25 degrees. In sharp contrast, the same surfaces, following treatment with a fluorosilane composition of the present invention, exhibit contact angles in the range of about 42 to 60 degrees.

The fluorosilanes suitable for use in this application are chosen from those having at least one hydrolyzable group and at least one nonhydrolyzable fluorine-containing organic group attached to a silicon atom. In accordance with the principles of the invention, the hydrolyzable group is involved in a reaction between the surfaces of the substrate and the fluorine-containing organic group donates the desired non-wetting properties to the treated substrate.

Suitable fluorosilanes are those of Formula I:

$$R^2{}_m SiR^3{}_{4-m} \qquad \qquad I$$

wherein:

$R^2$ is a fluorine-containing organic group;

$R^3$ is a hydrolyzable group; and m is 1 or 2.

In general, the non-wetting properties donated to the substrate by the fluorosilane coating improve with an increase in the degree of fluorination of the terminal region of $R^2$. Thus, $R^2$ will preferably contain at least one CF$_3$— group in the terminal region.

$R^2$ may be any suitable organic group, and preferably is a saturated organic group such as, for example, alkyl, alkoxyalkyl or alkylcarboxyalkyl. Preferred $R^2$ groups have the structure:

$$X_3C\text{—}(Y)_x\text{—}(Z)_y\text{—}(CH_2)_z\text{—}$$

wherein:

X is F or CF$_3$;

Y is CF$_2$, CF(CF$_3$) or C(CF$_3$)$_2$;

Z is a divalent atom or group;

x is 0 or a positive integer;

z is 0 or a positive integer; and y is 0 or 1.

Examples of $R^2$ groups include:

CF$_3$(CF$_2$)$_9$(CH$_2$)$_2$—  CF$_3$(CF$_2$)$_5$(CH$_2$)$_2$—
CF$_3$(CF$_2$)$_3$(CH$_2$)$_2$—  CF$_3$(CF$_2$)$_x$O(CH$_2$)$_2$—
(CF$_3$)$_2$CFO(CH$_2$)$_3$—  (CF$_3$)$_3$CCF$_2$O(CH$_2$)$_2$—

One or more of the $R^2$ and $R^3$ groups may be replaced by another monovalent atom or group, such as F, so long as the compound retains at least one fluorine-containing organic group and at least one hydrolyzable group, and that the replacement atom or group does not inhibit hydrolysis or adversely affect the non-wetting properties of the fluorosilane coating to an undesirable extent.

In accordance with this modification, suitable fluorosilanes may also be of Formula II:

$$R^2{}_m SiR^3{}_n R^4{}_p \qquad \text{II}$$

wherein:
R² is a fluorine-containing organic group;
R³ is a hydrolyzable group;
R⁴ is a non-hydrolyzable atom or group other than R²;
m is 1 or 2;
n is 1, 2 or 3;
p is 0, 1 or 2; and
the sum of m+n+p is 4.

Due to the improved anti-wetting properties associated with an increase in the fluorination of the terminal region of R², perfluorosilanes, and more particularly, perfluoroalkyl alkyl silanes are especially well suited for application in accordance with the principles of the present invention.

Preferred perfluoroalkyl alkylsilanes are compounds of Formula III:

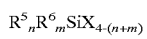

$$R^5{}_n R^6{}_m SiX_{4-(n+m)} \qquad \text{III}$$

wherein :
R⁵ is a perfluoroalkyl alkyl radical;
R⁶ is alkyl or alkenyl;
X is acetoxy, halogen or alkoxy;
n is 1 or 2; and
m is 0 or 1.

Preferred compounds of Formula III are those wherein n is 1.

Preferred R⁵ perfluoroalkyl radicals range from $CF_3$ to $C_{30}F_{61}$, more preferably from $C_6F_{13}$ to $C_{18}F_{37}$, and most preferably from $C_8F_{17}$ to $C_{12}F_{25}$.

Preferred R⁶ groups are selected from the group consisting of methyl, ethyl, propyl and vinyl, with methyl being the most preferred.

Preferred radicals for X include acetoxy, ethoxy, methoxy, chloro, bromo and iodo.

Preferred compounds of Formula II are the perfluoroalkyl ethylsilanes. As previously discussed, the fluorosilane compositions of the invention react with the substrate surface on a molecular basis and the perfluoroalkyl ethylsilanes exhibit a strong surface bonding, thus producing a coated substrate surface that provides a high contact angle. Examples of such compounds include perfluoroalkyl ethyltrichlorosilane, perfluoroalkyl ethyltriacetoxysilane, perfluoroalkyl ethyltrimethoxysilane, perfluoroalkyl ethyldichloro(methyl)silane and perfluoroalkyl ethyldiethoxy(methyl)silane.

Other fluorosilanes suitable for the present application are of Formula IV:

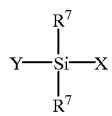

wherein:
Y is alkyl, alkoxyl or aryl having at least one fluorine;
X is a hydrolyzable group; and
R⁷ is X, Y or alkyl.

Preferred compounds of Formula IV are those wherein Y is an aliphatic hydrocarbon in which all hydrogens on a plurality of adjacent carbons are replaced by fluorine.

Examples of compounds of Formula IV are described in U.S. Pat. No. 5,194,326 and include: (3,3,3-trifluoropropyl) trichlorosilane, (3,3,3-trifluoropropyl)dimethylchlorosilane, (3,3,3-trifluoropropyl)methyldichlorosilane, (3,3,3-trifluoropropyl)methyldimethoxysilane, (tridecafluoro-1,1,2,2-tetrahydrooctyl)-1-trichlorosilane, (tridecafluoro-1,1,2,2-tetrahydrooctyl)-1-methyldichlorosilane, (tridecafluoro-1,1,2,2-tetrahydrooctyl)-1-dimethylchlorosilane, (heptadecafluoro-1,1,2,2-tetrahydrodecyl)-1-trichlorosilane, (heptadecafluoro-1,1,2,2-tetrahydrodecyl)-1-methyldichlorosilane, (heptadecafluoro-1,1,2,2-tetrahydrodecyl)-1-dimethylchlorosilane, (heptafluoroisopropoxy)propylmethyldichlorosilane, 3-(heptafluoroisopropoxy)propyltrichlorosilane and 3-(heptafluoroisopropoxy)propyltriethoxysilane.

Preferably, the fluorosilane composition is applied onto the circuitized substrate in solution. Suitable solvents include, for example, isopropanol, ethanol, hexane, heptane, methylene chloride, acetone, naphtha, toluene and water. More preferred solvents include fluorinated hydrocarbon solvents, such as trichlorotrifluoroethane, and perfluorinated organic compositions such as perfluorocarbons. The solution may be applied by any conventional application technique, such as, for example, dipping, flowing, wiping or spraying.

Preferred concentrations for the fluorosilane composition are within the range of about 0.005 to 5 percent by volume, and more preferably, within the range of about 0.05 to about 2.5 percent by volume. It has, however, been shown that solvent-free compositions, i.e., 100 percent reactive silanes, also provide good anti-wetting properties to a treated substrate.

Desired anti-wetting properties may be obtained with a mixture of different fluorosilane compositions. Examples of such mixtures include (3,3,3-trifluoropropyl) trimethoxysilane with phenyltrimethoxysilane, a mixture that is known to be thermally stable; and (heptadecafluoro-1,1,2,2-tetrahydrodecyl)-1-trimethoxysilane with phenyltrimethoxysilane.

The preferred embodiment of the present invention is hereinafter described in more detail by means of the following examples that are provided by way of illustration and not by way of limitation.

EXAMPLES

The contact angles recited in the following examples were measured using a Rame-hart, Inc. (Mountain Lakes, N.J.) Goniometer, Model No. 100-00 115. The surface to be measured was placed in a horizontal position, facing upward, in front of a light source. A drop of water or organic liquid was placed on top of the surface so that the contours of the sessile drop could be viewed and the contact angle measured through the goniometer telescope with a graduated circular protractor.

Control 1

A mixture comprised of about 70 ml of isopropyl alcohol and 30 milliliters (mL) of water is carefully mixed and kept at room temperature. The mixture was then applied onto a chip carrier via a dip coating method and allowed to dry at room temperature. The coated chip carrier was then exposed to moderate heat of about 120° for about 15 to 30 minutes. The contact angles formed by a sessile drop of an organic cylcoaliphatic epoxide diluent (ERL-4299) on both the gold and polyimide surfaces of the chip carrier were then measured. The results are shown in Table 1.

Example 1

The protocol established in Control 1 was employed to coat a chip carrier with a mixture comprised of about 2 mL of 1H,1H,2H,2H-perfluorooctyltriethoxy silane, 140 mL of isopropyl alcohol and 60 mL of water. The coated carrier was allowed to dry at room temperature and then exposed to moderate heat of about 120° to 150° for about 15 to 30 minutes. The efficiency of the treatment was again measured by the contact angle formed by a sessile drop of diluent ERL-4299 on both the gold and polyimide surfaces of the chip carrier. The results are shown in Table 1.

Example 2

The protocol established in Example 1 was repeated, coating a chip carrier with a mixture comprised of about 3 mL of 1H,1H,2H,2H-perfluorooctyltriethoxy silane, 140 mL of isopropyl alcohol and 60 mL of water. The resulting contact angles are shown in Table 1.

Control 2

The contact angles on both the gold and polyimide surfaces of a non-treated chip carrier were measured in accordance with the protocol of Control 1. The results are shown in Table 2.

Examples 3–12

A series of mixtures as shown in Table 2, containing either no silane (2 treatments were with a solvent only) or varying amounts of 1H,1H,2H,2H-perfluorooctyltriethoxy silane or 1H,1H,2H,2H-perfluoroalkyltriethoxy silane, in various solvents were prepared and left at room temperature. A chip carrier was immersed in one of each of the various mixtures for a period of about 25 to 30 seconds and then allowed to dry at room temperature. The chip carriers were then exposed to moderate heat of about 120° to 150° for about 15 to 30 minutes. The efficiency of each of the various treatments was measured in accordance with the same protocol as in Control 2. The resulting contact angles are shown in Table 2.

Using the established protocol, it was also determined that the contact angles did not significantly change after the chip carriers were allowed to stand at room temperature for about two hours. Separate tests employing a die attach adhesive demonstrated an absence of adhesive resin spreading on both the polyimide and gold surfaces of the chip carrier using the disclosed treatments.

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

TABLE 1

| TREATMENT | CONCENTRATION (% Vol) | CONTACT ANGLE (deg) POLYIMIDE | CONTACT ANGLE (deg) GOLD SURFACE |
|---|---|---|---|
| Control | 0.0% in (70/30 isopropyl alcohol/water) | 21 | 15 |
| 1H,1H,2H,2H-perfluorooctyltriethoxy silane | 1.0% in (70/30 isopropyl alcohol/water) | 54 | 56 |
| 1H,1H,2H,2H-perfluorooctyltriethoxy silane | 1.5% in (70/30 isopropyl alcohol/water) | 52 | 55 |

TABLE II

| TREATMENT | CONC. (%) | SOLVENT | CONTACT ANGLE (deg) POLYIMIDE | CONTACT ANGLE (deg) GOLD PAD |
|---|---|---|---|---|
| Control (No treatment) | 0.0 | | 15 | 17 |
| | | Propylene Glycol monomethyl ether | 16 | 14 |
| | | Butyl Carbitol | 17 | 19 |
| 1H,1H,2H,2H-perfluoroalkyltriethoxy silane | 0.5 | Propylene Glycol monomethyl ether | 53 | 52 |
| 1H,1H,2H,2H-perfluoroalkyltriethoxy silane | 2.0 | Propylene Glycol monomethyl ether | 55 | 54 |
| 1H,1H,2H,2H-perfluoroalkyltriethoxy silane | 0.5 | Butyl Carbitol/ Isopropyl Alc 50/10 | 52 | 49 |
| 1H,1H,2H,2H-perfluoroalkyltriethoxy silane | 0.5 | Propylene Glycol monomethyl ether | 42 | 44 |
| 1H,1H,2H,2H-perfluoroalkyltriethoxy silane | 3.0 | Propylene Glycol monomethyl ether | 44 | 35 |
| 1H,1H,2H,2H-perfluoroalkyltriethoxy silane | 2.0 | Butyl Carbitol | 59 | 50 |
| 1H,1H,2H,2H-perfluoroalkyltriethoxy silane | 0.5 | Butyl Carbitol | 54 | 46 |

We claim:

1. A method for selectively rendering a substrate non-wettable to an adhesive organic resin, said substrate comprising both organic and metallic surfaces, said method comprising coating the organic and metallic surfaces of the substrate with a single layer of a fluorosilane composition, said fluorosilane composition being applied directly onto said surfaces, and obtaining a substrate comprising both organic and metallic surfaces that are selectively non-wettable to an adhesive organic resin, wherein an electronic device can be wire bonded to said non-wettable metallic surfaces without being impaired by resin bleed from said adhesive organic resin, and wherein said metallic surfaces comprise conductive metals for making electrical connections, wherein said conductive metals are selected from the group consisting of copper, gold, nickel, palladium, and combinations thereof.

2. The method of claim 1, further comprising the step of attaching a wire to at least one of said metallic surfaces coated with said single layer of said fluorosilane composition.

3. The method of claim 1 wherein the substrate is a chip carrier for use in the manufacture of a semiconductor device.

4. The method of claim 1 wherein the fluorosilane composition is in solution at a concentration of about 0.005 to 5 percent by volume.

5. The method of claim 4 wherein the fluorosilane solution is comprised of a perfluoroalkyl alkyl silane in a suitable solvent.

6. A method for rendering a substrate selectively non-wettable to an adhesive organic resin, said substrate comprising both organic and metallic surfaces, said method comprising the sequential steps of:
   (a) providing a substrate comprising both organic and metallic surfaces, wherein said metallic surfaces comprise conductive metals for making electrical connections wherein said conductive metals are selected from the group consisting of copper, gold, nickel, palladium, and combinations thereof;
   (b) providing a solution comprised of a fluorosilane in a suitable solvent, the solution having a concentration of about 0.005 to 5 percent by volume;
   (c) applying the solution directly onto both the organic and metallic surfaces of the substrate to form a single layer;
   (d) allowing the substrate surfaces to dry; and
   (e) obtaining a fluorosilane-coated substrate wherein both said organic and metallic surfaces of said substrate are selectively non-wettable to an adhesive organic resin, and wherein an electronic device can be wire bonded to said coated metallic surfaces without being impaired by resin bleed from said adhesive organic resin.

7. The method of claim 6 further comprising baking the dried fluorosilane-coated substrate at a temperature of about 100 to 250° C. for a period of about 2 to 30 minutes.

8. The method of claim 7 wherein the baking is at a temperature of about 120 to 150° C. for a period of about 15 to 30 minutes.

9. The method of claim 6 wherein the substrate is a chip carrier for use in the manufacture of a semiconductor device.

10. The method of claim 6 wherein the solution is applied to the surfaces of the substrate by dipping, flowing or spraying.

11. The method of claim 6 wherein the fluorosilane is of Formula I $$R^2{}_m SiR^3{}_{4-m} \qquad \text{I}$$

wherein:
   $R^2$ is a fluorine-containing organic group;
   $R^3$ is a hydrolyzable group; and
   m is 1 or 2.

12. The method of claim 11 wherein $R^2$ has the structure $$X_3C-(Y)_x-(Z)_y-(CH_2)_z-$$

wherein:
   X is F or $CF_3$;
   Y is $CF_2$, $CF(CF_3)$ or $C(CF_3)_2$;
   Z is a divalent atom or group;
   x is 0 or a positive integer;
   z is 0 or a positive integer; and
   y is 0 or 1.

13. The method of claim 6 wherein the fluorosilane is of Formula II $$R^2{}_m SiR^3{}_n R^4{}_p \qquad \text{II}$$

wherein:
   $R^2$ is a fluorine-containing organic group;
   $R^3$ is a hydrolyzable group;
   $R^4$ is a non-hydrolyzable atom or group other than $R^2$;
   m is 1 or 2;
   n is 1, 2 or 3;
   p is 0, 1 or 2; and
   the sum of m+n+p is 4.

14. The method of claim 6 wherein the fluorosilane is a perfluoroalkyl alkylsilane of Formula III $$R^5{}_n R^6{}_m SiX_{4-(n+m)} \qquad \text{III}$$

wherein
   $R^5$ is a perfluoroalkyl alkyl radical;
   $R^6$ is alkyl or alkenyl;
   X is acetoxy, halogen or alkoxy;
   n is 1 or 2; and
   m is 0 or 1.

15. The method of claim 14 wherein:
   n is 1;
   $R^5$ is $CF_3$ to $C_{30}F_{61}$;
   $R^6$ is methyl, ethyl, propyl or vinyl; and
   X is acetoxy, ethoxy, methoxy, chloro, bromo or iodo.

16. The method of claim 14 wherein the fluorosilane is a perfluoroalkyl ethylsilane.

17. The method of claim 6 wherein the fluorosilane is of Formula IV $$\underset{R^7}{\overset{R^7}{Y-Si-X}} \qquad \text{IV}$$

wherein:
   Y is alkyl, alkoxyl or aryl having at least one fluorine;
   X is a hydrolyzable group; and
   $R^7$ is X, Y or alkyl.

18. The method of claim 17 wherein Y is an aliphatic hydrocarbon in which all hydrogens on a plurality of adjacent carbons are replaced by fluorine.

19. The method of claim 6, further comprising:
   (f) attaching a wire to at least one of said metallic surfaces coated with said single layer of said fluorosilane composition.

* * * * *